United States Patent
Goebel et al.

(10) Patent No.: US 6,944,044 B2
(45) Date of Patent: Sep. 13, 2005

(54) METHOD FOR READING OUT OR IN A STATUS FROM OR TO A FERROELECTRICAL TRANSISTOR OF A MEMORY CELL AND MEMORY MATRIX

(75) Inventors: Holger Goebel, Hamburg (DE); Heinz Hoenigschmid, Essex Junction, NY (US); Wolfgang Hönlein, Unterhaching (DE); Thomas Haneder, Dachau (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/432,441

(22) PCT Filed: Dec. 19, 2001

(86) PCT No.: PCT/DE01/04785

§ 371 (c)(1),
(2), (4) Date: Sep. 26, 2003

(87) PCT Pub. No.: WO02/50842

PCT Pub. Date: Jun. 27, 2002

(65) Prior Publication Data

US 2004/0076057 A1 Apr. 22, 2004

(30) Foreign Application Priority Data

Dec. 21, 2000 (DE) .......................................... 100 64 031

(51) Int. Cl.$^7$ ............................................. G11C 11/12
(52) U.S. Cl. ....................................... 365/145; 365/117
(58) Field of Search ........................... 365/145, 65, 117, 365/189.01

(56) References Cited

U.S. PATENT DOCUMENTS

| 5,515,311 | A | | 5/1996 | Mihara |
| 5,959,879 | A | | 9/1999 | Koo |
| 6,067,244 | A | * | 5/2000 | Ma et al. ..................... 365/145 |
| 6,515,889 | B1 | * | 2/2003 | Salling et al. .............. 365/145 |

OTHER PUBLICATIONS

T. Nakamura, et al. A Single–Transistor Ferroelectric Memory Cell, IEEE International Solid–State Circuits Conference, ISSCC95, Session 4, Technology Directions: Displays, Photonics and Ferroelectric Memoris, pp. 68–69, 1995.

Metal–Ferroelectric–Semiconductor Field–Effect Transistor (MFSFET) for Single Transistor Memory by Using Poly–Si Source/Drain and BaMgF4 Dielectric, IEDM 1996, pp. 5503–5506, 1998.

* cited by examiner

*Primary Examiner*—Thong Q. Le
(74) *Attorney, Agent, or Firm*—Altera Law Group, LLC; Jeffrey R. Stone

(57) ABSTRACT

The state is read out from the ferroelectric transistor or stored in the ferroelectric transistor. During the read-out or storage of the state, at least one further ferroelectric transistor in the memory matrix is driven in such a way that it is operated in its depletion region.

20 Claims, 7 Drawing Sheets

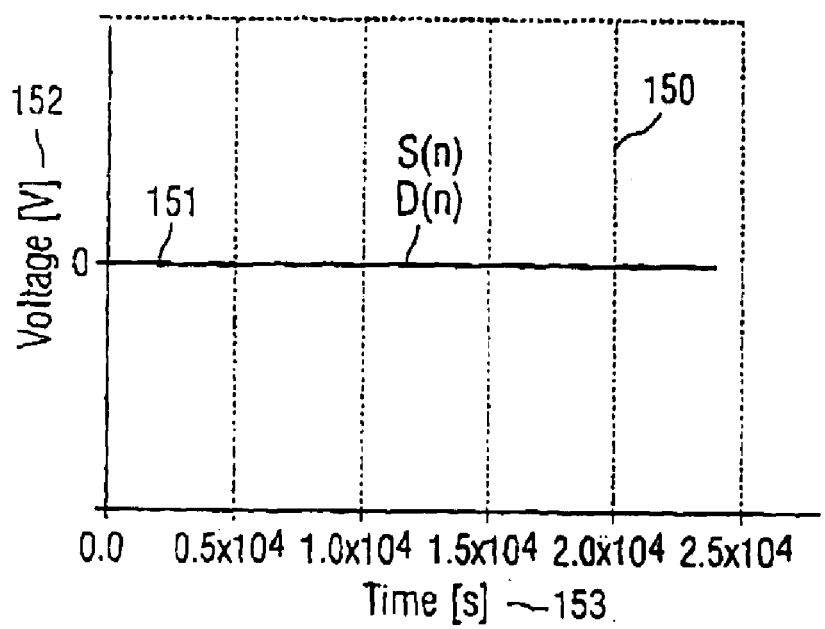
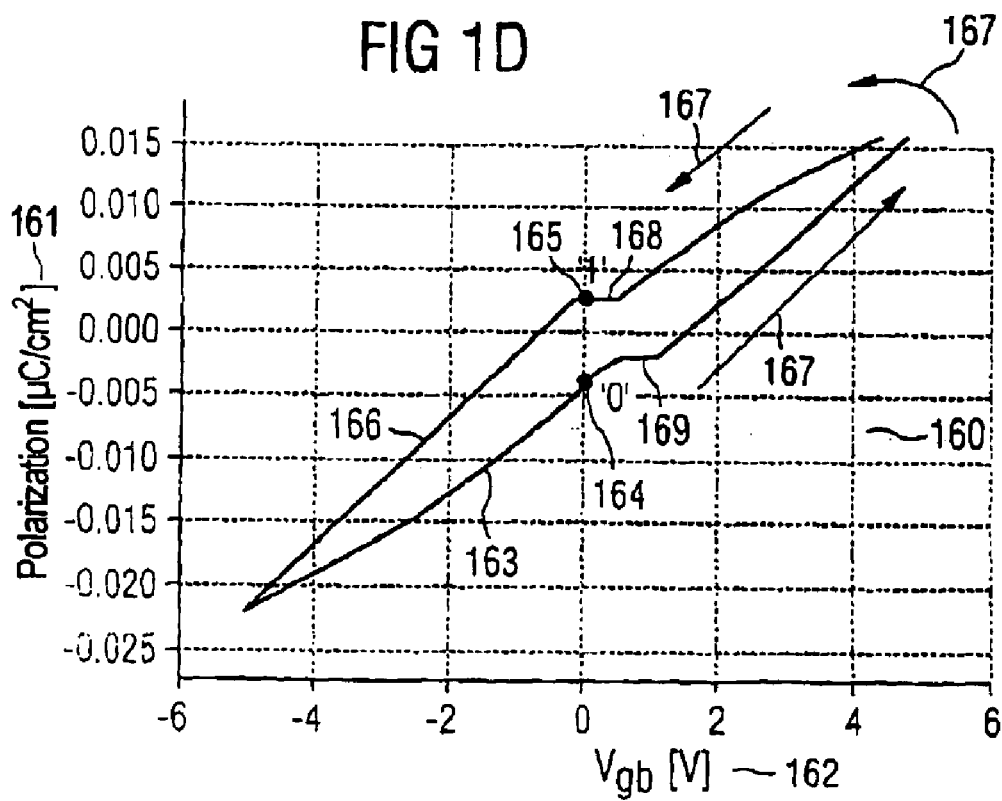

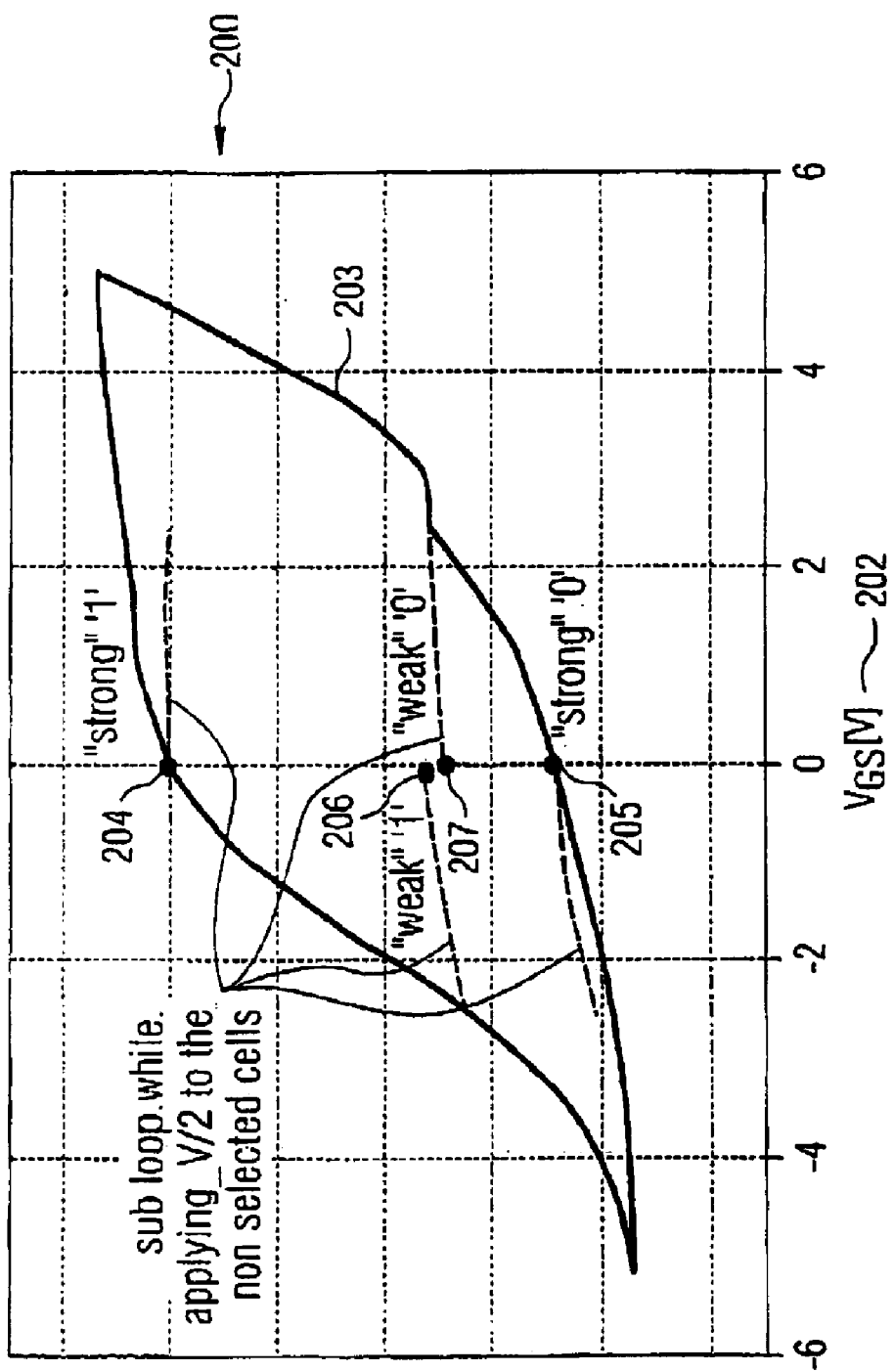

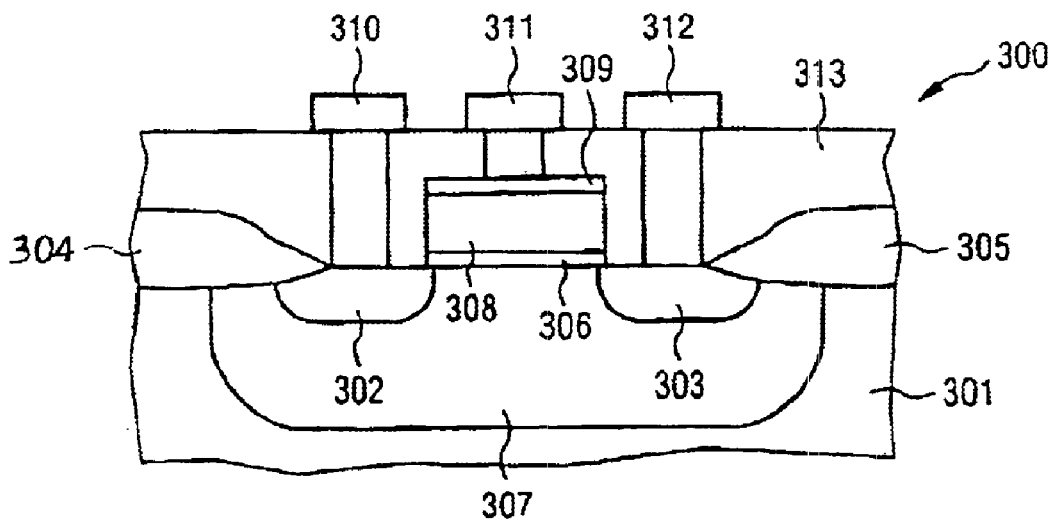
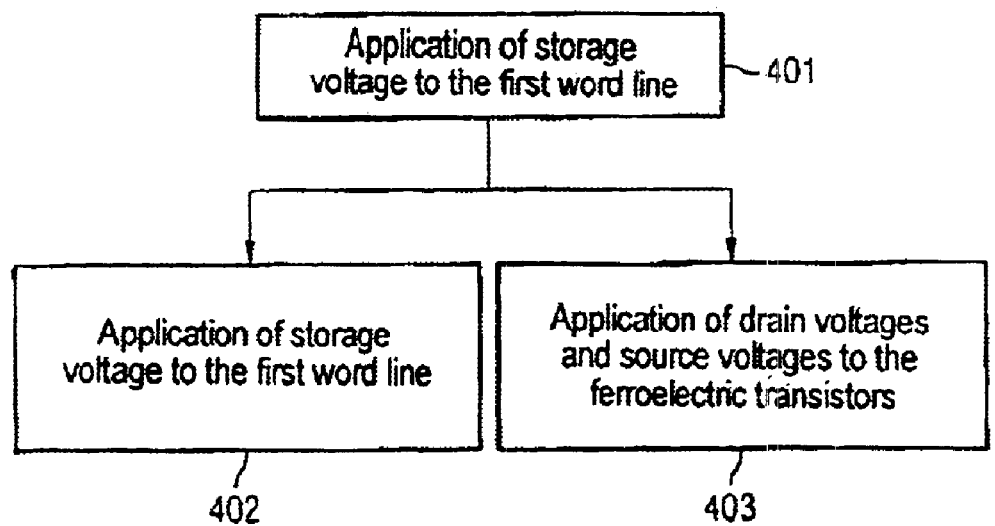

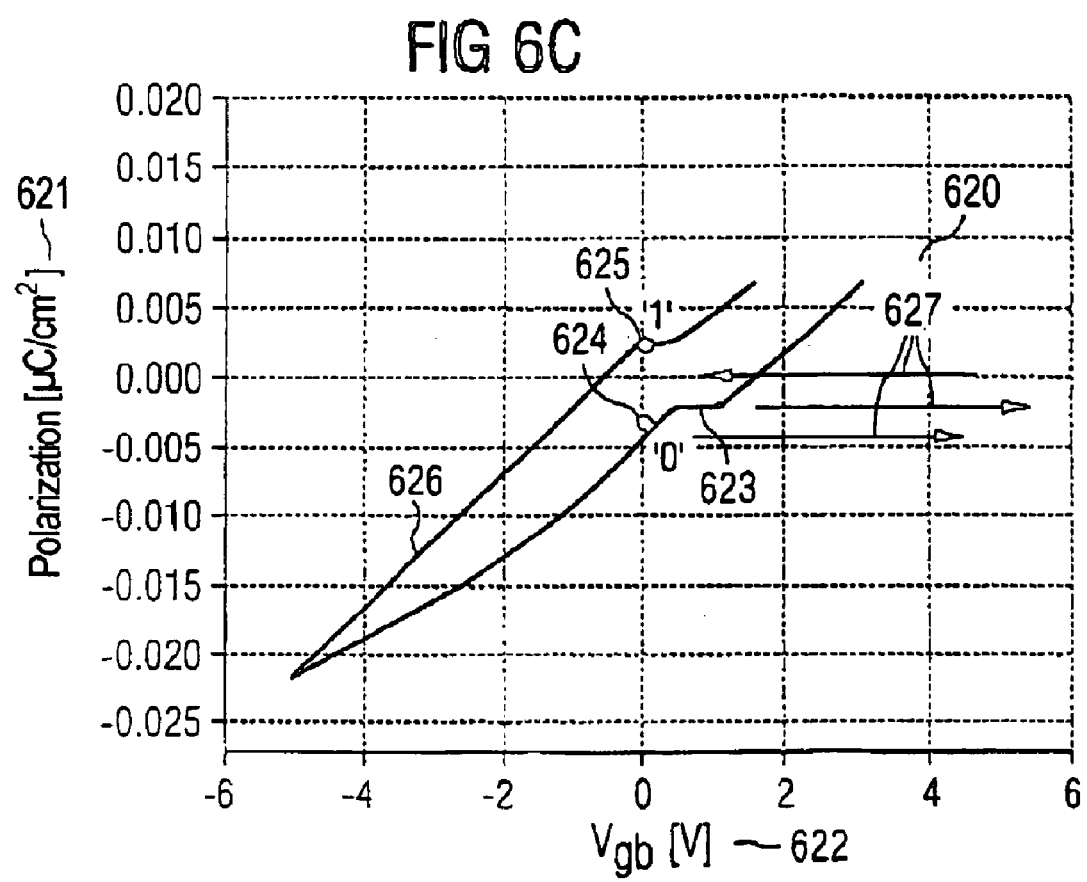

METHOD FOR READING OUT OR IN A STATUS FROM OR TO A FERROELECTRICAL TRANSISTOR OF A MEMORY CELL AND MEMORY MATRIX

BACKGROUND OF THE INVENTION

1. Field of the Invention

The invention relates to a method for reading out and storing the state from or in a ferroelectric transistor of a memory cell and to a memory matrix.

2. Description of the Related Prior Art

Such a method and such a memory matrix are disclosed in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995.

The memory matrix disclosed in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995 is a matrix having a multiplicity of memory cells each having a ferroelectric transistor which are connected to one another in a form of a square matrix. Furthermore, the memory matrix has a read-out/storage control device, which can be used to store a state of a ferroelectric transistor of a memory cell in the memory matrix or can be used to read out the present state of the corresponding ferroelectric transistor of the memory cell.

In accordance with the procedure described in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995, if a state in a ferroelectric transistor of a memory cell of the memory matrix is stored, erased or read, a corresponding read-out/storage voltage is applied to the corresponding word lines and bit lines. The application of the required read-out/storage voltage also influences further ferroelectric transistors which lie adjacent in the memory matrix and are connected to the ferroelectric transistor whose state is intended to be stored or read out. In this way, it can happen that, as a result of the read-out or storage of a state of one ferroelectric transistor of the memory matrix, a state of a further ferroelectric transistor of the memory matrix is altered erroneously, that is to say unintentionally.

As is described in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995, a read-out/storage voltage of $V_{pp}/V_{rr}$ is present at the ferroelectric transistor from or in which a state is intended to be read out or stored. In this case, an interference voltage of approximately $\pm V_{pp}/2$ or $\pm V_{pp}/3$ is present at the adjacent further ferroelectric transistors connected to the said ferroelectric transistor, and the state of the corresponding further ferroelectric transistor can be erroneously altered by the said interference voltage.

This problem area will be explained below with reference to FIG. 2.

FIG. 2 illustrates a diagram 200 with a profile of the ferroelectric polarization 201 in the gate of a ferroelectric transistor as a function of an applied gate voltage $V_{GS}$ 202. In the diagram 200 the gate voltage 202 is specified in volts ([V]) and the ferroelectric polarization 201 is specified in coulomb/m$^2$ ([C/m$^2$]).

The profile of the ferroelectric polarization 201 as a function of the gate voltage $V_{GS}$ 202 is described by a hysteresis loop 203. As can be gathered from FIG. 2, a customary ferroelectric transistor has two stable polarization states, a first stable polarization state 204 and a second stable polarization state 205. As a result of a change in the applied gate voltage $V_{GS}$, in particular as a result of an above-described "interference voltage" of $V_{pp}/2$ or $V_{pp}/3$, the state of the ferroelectric transistor can undergo transition along the hysteresis loop 203 into electrically non-distinguishable polarization states, namely into a first non-distinguishable polarization state 206 and into a second non-distinguishable polarization state 207.

Whereas it is possible in a simple manner to electrically distinguish the first distinguishable polarization state 204 from the second distinguishable polarization state 205, whereby two different states can be realized and identified by the ferroelectric transistor within the memory matrix, such electrical distinguishability is not ensured in the case of the non-distinguishable polarization states 206, 207.

Consequently, as a result of such an interference voltage, the state stored in adjacent further ferroelectric transistors in the memory matrix can be altered or at least become undefined, in other words a polarization state is formed in the corresponding adjacent ferroelectric transistor which cannot reliably be read out, that is to say electrically distinguished.

BRIEF SUMMARY OF THE INVENTION

A further ferroelectric transistor and a method for fabricating it are described in U.S. Pat. No. 6,067,244 to Ma et al.

Jong-Son Lyu et al., Metal-Ferroelectric-Semiconductor Field-Effect Transistor (MFSFET) for Single Transistor Memory by Using Poly-Si Source/Drain and BaMgF$_4$ Dielectric, IEDM 1996, pp. 503–506, 1996 describes a ferroelectric DRAM memory, each memory cell having a ferroelectric field-effect transistor as its respective memory element. Furthermore, the ferroelectric DRAM memory contains a read and refresh circuit coupled to the memory cells which serves for reading the data stored in the respective memory cells, by detecting the source/drain conductivity of the respective ferroelectric field-effect transistor, and for refreshing the data stored in the ferroelectric field-effect transistors.

Consequently, the invention is based on the problem of reading out a state from a ferroelectric transistor or storing a state in a ferroelectric transistor of a memory cell, which memory cell is arranged in a memory matrix with a plurality of further memory cells with further ferroelectric transistors, the intention being to avoid the situation in which the further ferroelectric transistors in further memory cells of the memory matrix are transferred into a non-distinguishable polarization state as a result of the read-out or storage of a ferroelectric transistor.

The problem is solved by means of the method for reading out or storing a state from or in a ferroelectric transistor of a memory cell and also by means of a memory matrix having the features in accordance with the independent patent claims.

In a method for reading out or storing a state from or in a ferroelectric transistor of a memory cell which is arranged in a memory matrix with a plurality of further memory cells with further ferroelectric transistors, the state is read out from the ferroelectric transistor or stored in the ferroelectric transistor. At least one further ferroelectric transistor is driven during the read-out or storage of the state in such a way that the further ferroelectric transistor is operated in its depletion region.

A memory matrix has a plurality of memory cells connected to one another, at least some of the memory cells having at least one ferroelectric transistor. Furthermore, a readout/storage control device is provided in the memory matrix, which device controls a read-out or storage of a state from or in a ferroelectric transistor of a memory cell of the memory matrix. The read-out/storage control device is set up in such a way that the state is read out from the ferroelectric transistor or is stored in the ferroelectric transistor. The read-out/storage control device is furthermore set up in such a way that at least one further ferroelectric transistor in the memory matrix is driven during the read-out or storage of the state in such a way that the further ferroelectric transistor is operated in its depletion region.

The invention can clearly be seen in the fact that it has been recognized that, in order to programme a ferroelectric transistor in a memory cell, the said transistor must be brought into its inversion region. However, an adjacent ferroelectric transistor of an adjacent memory cell should not be programmed unintentionally, so that it should be ensured that these are not brought into their respective inversion region. This is ensured in that, according to the invention, at least one further ferroelectric transistor in the memory matrix or all further ferroelectric transistors in the memory matrix are operated in their respective depletion region during the read-out or storage of a state from or in the ferroelectric transistor.

Compared with the prior art, the invention makes it possible for the first time for the programming scheme of the ferroelectric transistors in the memory matrix not to restrict the gate-bulk voltage (also referred to as gate-substrate voltage below) of the further ferroelectric transistors to $V_{pp}/2$ or $V_{pp}/3$, as is necessary in the case of the programming scheme from T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995.

As a result, contrary to the procedure described in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995, the bulk potential in the further ferroelectric transistors in the memory matrix can be kept constant.

Since, according to the invention, the entire bulk material does not have to be subjected to charge reversal in this case, there is a considerable reduction both in the electric charge required for programming and in the time required for programming a ferroelectric transistor in a memory matrix.

Thus, it has clearly been recognized according to the invention that the disturb behaviour of a memory constructed from ferroelectric transistors is crucially influenced by a suitable choice of the gate-source voltage which is applied to the further ferroelectric transistors, during the read-out or storage of a state from or in a ferroelectric transistor.

Preferred developments of the invention emerge from the dependent claims.

The configurations described below relate both to the method and to the configuration of the read-out/storage control device, in which case, in accordance with the corresponding development, the read-out/storage control device is in each case set up in such a way that the corresponding development is realized.

The corresponding configuration of the read-out/storage control device can be realized by means of a computer program which is provided in a memory of the read-out/storage control device and is executed by means of a processor, in software or in hardware by means of an electronic special circuit.

In a preferred configuration of the invention, it is provided that the state is read out from the ferroelectric transistor or stored in the ferroelectric transistor by a read-out/storage voltage being applied to the gate electrode of the ferroelectric transistor, for the purpose of reading out or storing the state.

A plurality of transistors, in particular a plurality of ferroelectric transistors, may be used in a memory cell of the memory matrix.

Even though a ferroelectric transistor which has been fabricated in accordance with a specific method is used in the further exemplary embodiment, an arbitrary further ferroelectric transistor can nonetheless be used in an alternative embodiment within the scope of the invention.

Thus, in particular, it is possible to use different materials for the dielectric intermediate layer (in particular having a thickness of between approximately 3 nm and 25 nm) of the ferroelectric transistor, which comprise, for example, cerium oxide $CeO_2$, hafnium oxide $HfO_2$, praseodymium oxide $Pr_2O_3$, zirconium oxide $ZrO_2$, titanium oxide $TiO_2$, tantalum oxide $TaO_2$ or dialuminium trioxide $Al_2O_3$.

By way of example, BMF ($BaMgF_4$), PZT (($PbZr)TiO_3$) or SBT ($SrBi_2Ta_2O_9$) can be used as the ferroelectric layer. The ferroelectric layer has a thickness of between approximately 30 nm and 300 nm.

Furthermore, the invention can also be used in the context of a p-channel ferroelectric transistor, even though the invention is clearly described using an n-channel ferroelectric transistor in the further exemplary embodiment. In this case, it is necessary merely to reverse the polarity of the voltages that are to be correspondingly applied.

Moreover, it is possible to provide a plurality of electrical intermediate layers within a ferroelectric transistor which have one or more of the materials described above.

Generally, an arbitrary insulator with the largest possible dielectric constant and a high band gap can be used for the electrical intermediate layer of the ferro electric transistor.

The ferroelectric layer can also be deposited directly on the substrate if the formation of disturbing intermediate layers can be avoided, for example by epitaxial growth of the ferroelectric layer.

It should be noted in this connection that the invention is not restricted to the structure of the ferro electric transistor described in the exemplary embodiment, rather that, for example, the structure of a ferro electric transistor which is described in T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995 or Jong-Son Lyu et al., Metal-Ferroelectric-Semiconductor Field-Effect Transistor (MFSFET) for Single Transistor Memory by Using Poly-Si Source/Drain and $BaMgF_4$ Dielectric, IEDM 1996, pp. 503–506, 1996 can also readily be used within the scope of the invention.

The further ferroelectric transistor or a plurality of further ferroelectric transistors in the memory matrix can be operated in their depletion regions during the read-out or storage of the state from the ferroelectric transistor or in the ferroelectric transistor by the further ferroelectric transistors being driven in such a way that the gate-source voltages present at the further ferroelectric transistors are less than the respective threshold voltage thereof.

This driving of the further ferroelectric transistor or transistors is possible very simply and thus very cost-effectively without the permanent properties of the ferroelectric transistors themselves having to be altered.

Furthermore, the further ferroelectric transistor or transistors can be operated in the respective depletion region by the further ferroelectric transistor or transistors being driven in such a way that the following holds true:

$$V_{FB} - F(P_{FE}) \leq V_{GS} \leq V_{th} - F(P_{FE}),$$

where $V_{FB}$ designates the flat-band voltage of the further ferroelectric transistor, $V_{GS}$ designates the gate-source voltage of the further ferroelectric transistor, $V_{th}$ designates the threshold voltage of the further ferroelectric transistor, $F(P_{FE})$ designates a function of the ferroelectric polarization $P_{FE}$ of the further ferroelectric transistor.

In accordance with another development of the invention, the further ferroelectric transistor or transistors is or are driven in such a way that, in the respective further ferroelectric transistor, the applied gate voltage is equal to the respectively applied source voltage and the applied drain voltage.

This ensures that the gate-source voltage of the respective further ferroelectric transistor is equal to the gate-drain voltage of the further ferroelectric transistor, namely has the value 0 volts, which means that the gate-source voltage which is present at the respective further ferroelectric transistor is always less than the threshold voltage thereof.

BRIEF DESCRIPTION OF THE DRAWINGS

An exemplary embodiment of the invention is illustrated in the figures and is explained in more detail below:

In the figures:

FIGS. 1a to 1d show a memory matrix having four memory cells each having a ferroelectric transistor (FIG. 1a), a voltage profile of an electric voltage applied to the gate of a selected memory cell (FIG. 1b), a voltage profile of an electric voltage applied to the source of a selected memory cell (FIG. 1c), and a diagram illustrating the profile of the polarization of the selected ferroelectric transistor as a function of the gate-bulk voltage applied thereto;

FIG. 2 shows a diagram illustrating the profile of the ferroelectric polarization in the gate of a customary ferroelectric transistor as a function of the gate voltage present during the read-out or storage of a state from or in the ferroelectric transistor in accordance with the prior art;

FIG. 3 shows a sketch of a ferroelectric transistor in accordance with an exemplary embodiment of the invention;

FIG. 4 shows a flow diagram illustrating the individual steps for reading out or storing a state from or in a ferroelectric transistor in accordance with an exemplary embodiment of the invention;

FIGS. 6a to 6c show a voltage profile of an electric voltage applied to the gate of a further, non-selected memory cell (FIG. 6a), a voltage profile of an electric voltage applied to the source of the further, non-selected memory cell (FIG. 6b), and a diagram illustrating the profile of the polarization of the non-selected ferroelectric transistor as a function of the gate-bulk voltage applied thereto.

DETAILED DESCRIPTION OF THE INVENTION

Figure 1A:
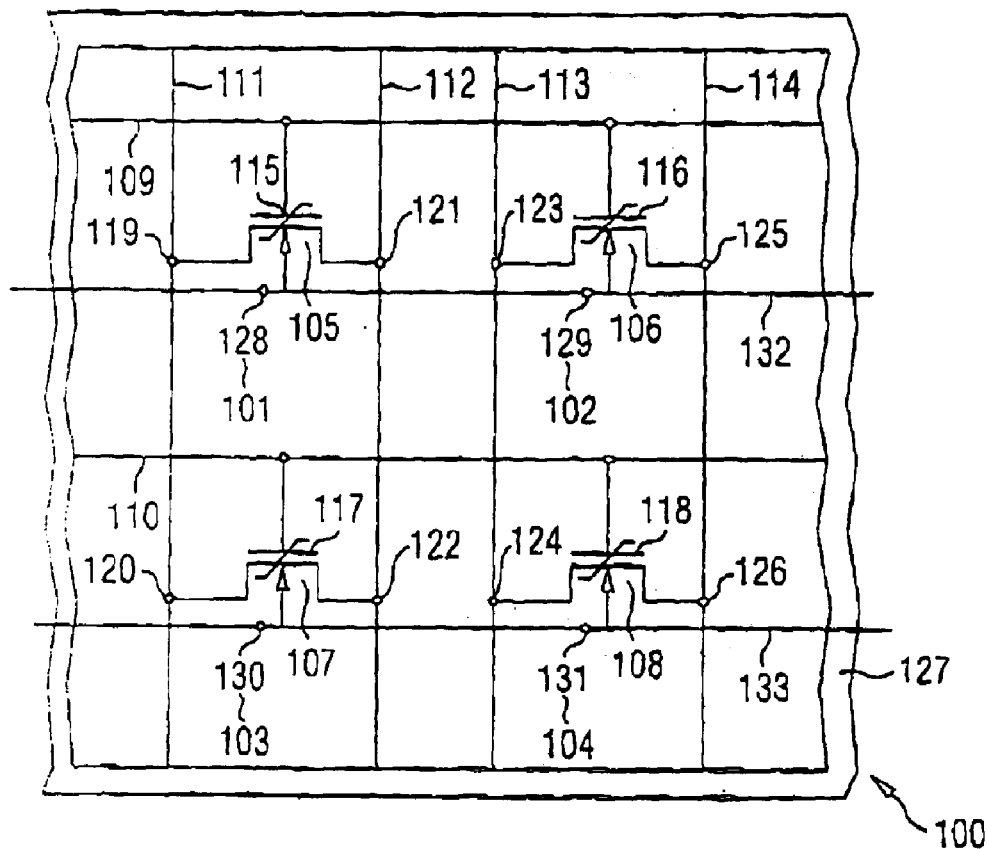

FIG. 1a shows a memory matrix 100 having four memory cells 101, 102, 103, 104.

Each memory cell 101, 102, 103, 104 has a ferroelectric transistor 105, 106, 107, 108.

Furthermore, the memory matrix 100 has a first word line 109 and a second word line 110.

Furthermore, the memory matrix 100 has a first bit line 111, a second bit line 112, a third bit line 113 and a fourth bit line 114.

The gate 115 of the first ferroelectric transistor 105 and also the gate 116 of the second ferroelectric transistor 106 are coupled to the first word line 109.

The gate 117 of the third ferroelectric transistor 107 and the gate 118 of the fourth ferroelectric transistor 108 are coupled to the second word line 110.

The source 119 of the first ferroelectric transistor 105 and the source 120 of the third ferroelectric transistor 107 are coupled to the first bit line 111.

The drain 121 of the first ferroelectric transistor 105 and the drain 122 of the third ferroelectric transistor 107 are connected to the second bit line 112.

The source 123 of the second ferroelectric transistor 106 and the source 124 of the fourth ferroelectric transistor 108 are connected to the third bit line 113.

The drain 125 of the second ferroelectric transistor 106 and the drain 126 of the fourth ferroelectric transistor 108 are connected to the fourth bit line 114.

The word lines 109, 110 and also the bit lines 111, 112, 113, 114 are connected to a read-out/storage control device 127.

Furthermore, the bulk terminals 128, 129 of the first ferroelectric transistor 105 and of the second ferroelectric transistor 106 are coupled to one another via a further electrical line 132.

Furthermore, the bulk terminals 130, 131 of the third ferroelectric transistor 107 and of the fourth ferroelectric transistor 108 are coupled to one another via a further electrical line 133.

The storage of a state of a ferroelectric transistor in the memory matrix 100 and also the read-out of a state of a ferroelectric transistor in the memory matrix 100 are controlled by the read-out/storage control device 127 by the application of different voltages to the corresponding word lines 109, 110 and/or to the corresponding bit lines 111, 112, 113, 114, as is explained in more detail below.

FIG. 3 shows a ferroelectric transistor 300, as is provided as the first ferroelectric transistor 105, as the second ferroelectric transistor 106, as the third ferroelectric transistor 107 and as the fourth ferroelectric transistor 108 in the memory matrix 100.

The ferroelectric transistor 300 has a p-doped substrate 301 made of silicon, and also a source region 302 and a drain region 303, adjoining which two silicon oxide regions 304, 305 are arranged. These regions are deposited by means of a customary CVD method. Afterwards, a dielectric intermediate layer 306 is deposited above the channel region 307 between the source region 302 and the drain region 303 of the ferroelectric transistor 300, made of silicon oxide. As an alternative, the dielectric intermediate layer 306 may also comprise a different dielectric, for example $Al_2O_3$, $CeO_2$, $ZrO_2$, $HfO_2$, or $Pr_2O_3$, which is applied for example with the aid of a CVD method.

A ferroelectric layer 308 is then applied thereon for example with the aid of a CVD method, which layer may contain SBT ($SrBi_2Ta_2O_9$) or PZT ($(Pb,Zr)TiO_3$).

The tempering of these two layers 306, 308 for setting the desired layer properties can be effected in turn, that is to say after the deposition of each individual layer, but it can also be effected—if this is desired—in one step after the deposition of both layers 306, 308.

The dielectric intermediate layer 306 and the ferroelectric layer 308 are subsequently patterned by an etching process.

If a metallic gate electrode 309 is used, then it is produced by means of a sputtering method and subsequently patterned by an etching process.

The metallic electrode can be used as a hard mask for the patterning of the layers situated underneath.

The implantation of the source region 302 and of the drain region 303 can be effected in a self-aligned manner with respect to the gate stack.

The remaining process steps before and after the fabrication of the ferroelectric gate stack can be effected analogously to standard CMOS manufacturing methods.

Furthermore, the ferroelectric transistor 300 has contacts 310, 311, 312, which are correspondingly conductively connected to the source 302, the drain 303 and the gate electrode 309.

Furthermore, the ferroelectric transistor 300 has a silicon planarization layer 313.

The read-out and storage of a state in the first ferroelectric transistor 105 is explained in more detail below with reference to FIG. 4 and FIG. 1b, FIG. 1c and FIG. 1d.

In a first step (step 401), in order to store a first state, a storage voltage $V_{pp}$, which is $V_{pp}$=5 V in accordance with the exemplary embodiment, is applied to the first word line 109.

A gate-source voltage is applied across the gate of the respective further ferroelectric transistors 106, 107, 108, as is explained in more detail below.

To put it another way, this means that the gate voltage which is explained in more detail below is applied to the non-selected second word line 110 and a source voltage is applied to the non-selected third bit line 113 and a drain voltage which is explained in more detail below is applied to the non-selected fourth bit line 114.

Figure 1B:
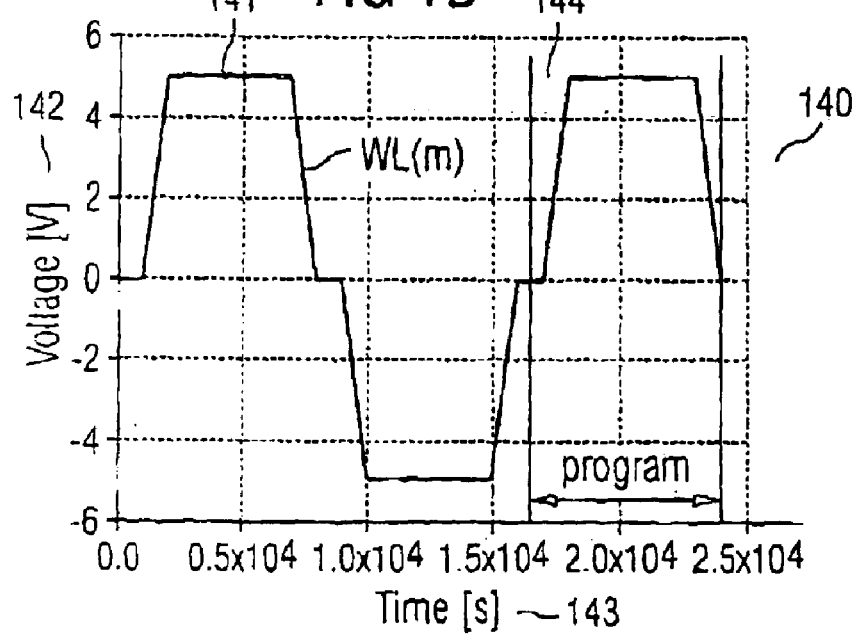

FIG. 1b shows, in a first voltage diagram 140, a voltage profile 141 of an electric voltage 142, applied to the first word line 109, as a function of the time t 143 in seconds.

In particular, the first voltage diagram 140 illustrates a programming region 144, during which the first ferroelectric transistor 105 is programmed, that is to say is reprogrammed from an initial state "0" to a final state "1", by the application of an electric voltage $V_{pp}$=5 V.

As is illustrated in the second voltage diagram 150 (cf. FIG. 1c) associated with FIG. 1b, during the programming of the first ferroelectric transistor 105, a voltage of 0 volts is applied to the first bit line 111 and to the second bit line 112, as can be gathered from the voltage signal profile 151 of the second voltage diagram 150, in which the electric voltage 152 respectively present on the first bit line 111 and the second bit line 112 is illustrated as a function of the time t 153 in seconds.

FIG. 1d shows the polarization profile 163 of the selected first ferroelectric transistor 105 in a polarization diagram 160 illustrating the polarization 161 in $\mu C/cm^2$ as a function of the gate-substrate voltage $V_{GB}$ 162 in volts that is present.

FIG. 1d shows that from the initial state "0" 164, by application of the electric voltage $V_{pp}$=5 V to the first word line 109, the first ferroelectric transistor 105 undergoes a transition to the final state "1" 165 along the hysteresis curve 166 in accordance with the profile symbolized by arrows 167.

FIG. 1d furthermore shows two plateau regions in the hysteresis loop 166, a first plateau region 168 and a second plateau region 169, which at least partly run essentially parallel to one another but are displaced relative to one another along the gate-substrate voltage 162 and, furthermore, each have a different polarization, which is what actually makes it possible to distinguish the two states 164, 165.

To put it another way, this means that the first ferroelectric field-effect transistor 105 is programmed by the application of a voltage difference between the gate and the substrate terminal of the first ferroelectric transistor 105.

Figure 5:
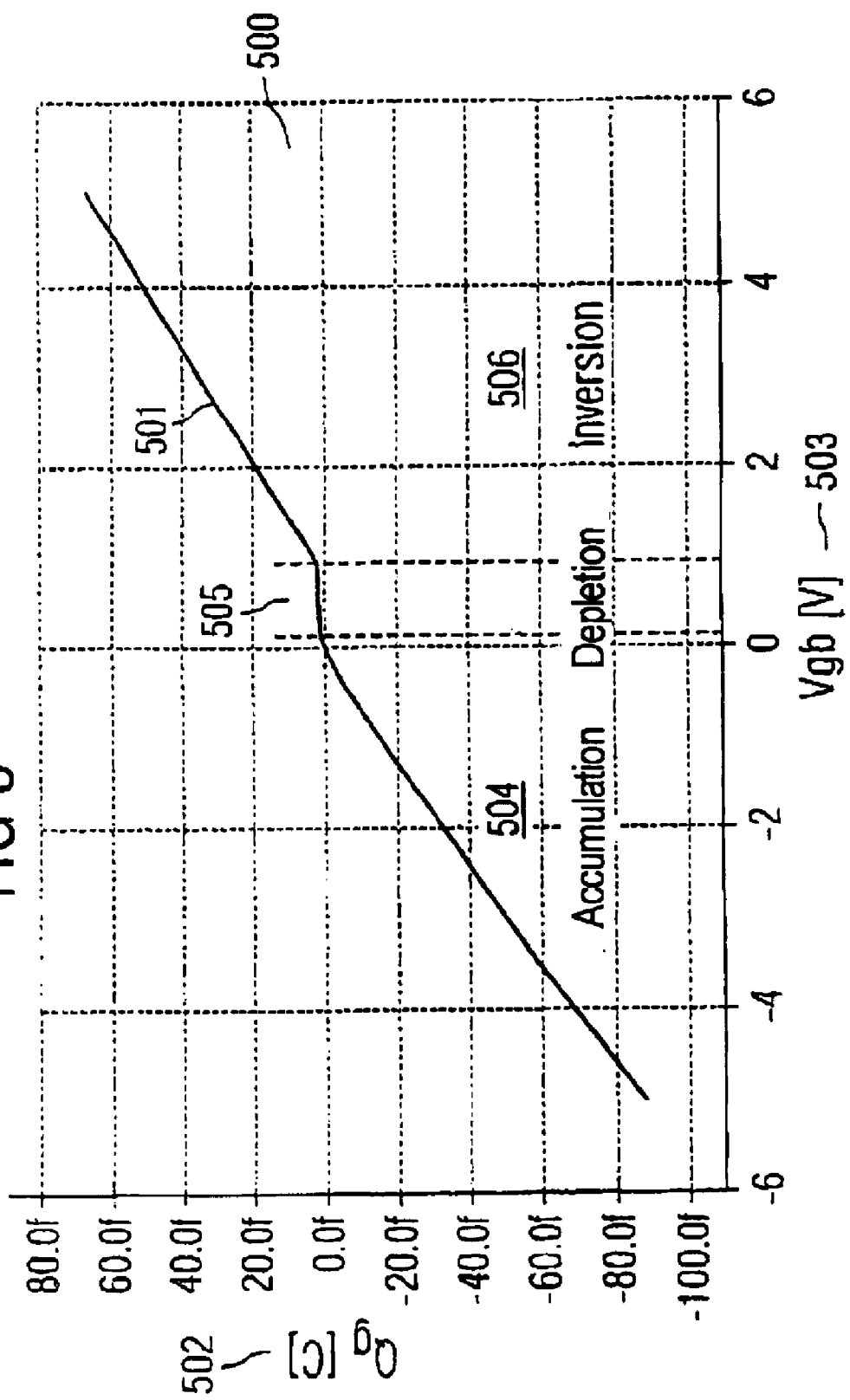
FIG. 5 shows a diagram illustrating the profile of the gate charge as a function of the gate-bulk voltage present at a ferroelectric transistor.

Given a suitable doping of the substrate and also a suitable gate oxide capacitance of the first ferroelectric transistor 105, the gradient of the gate charge curve 501, as is illustrated by way of example in a charge diagram 500 in FIG. 5, is significantly larger in the inversion region of the said transistor than in the depletion region of the said transistor.

FIG. 5 shows the profile of the gate charge $Q_g$ 502 as a function of the gate-substrate voltage $V_{GB}$ 503 that is present, and the gate charge profile 501, which can be divided into three regions 504, 505, 506.

A first region 504 is referred to as the accumulation region, a second region 505 represents the depletion region of the ferroelectric transistor and a third region 506 represents the inversion region of the said transistor.

In order to programme a ferroelectric transistor which forms a memory cell, the ferroelectric transistor is brought into its inversion region 506.

In order that a ferroelectric transistor which is adjacent to the ferroelectric transistor is not likewise programmed in an undesirable manner, it must be ensured according to the invention that the former transistor is not brought into its respective inversion region 506.

As is explained in more detail below, this is ensured by the suitable choice of a gate-source voltage $V_{GS}$, the gate-source voltage $V_{GS}$ being applied to the non-selected cells, that is to say the further ferroelectric transistors 106, 107, 108, in such a way that it is less than the threshold voltage $V_{th}$, which is dependent on the respective polarization of the ferroelectric transistor, in other words the following holds true:

$$V_{GS}-V_{th}+F(P_{FE})\leq 0, \qquad (1)$$

where $F(P_{FE})$ designates a function of the ferroelectric polarization $P_{FE}$ of the further ferroelectric transistor.

In FIG. 4, the step of programming the first ferroelectric transistor 105 is represented symbolically in a further block 402.

Figure 6A:
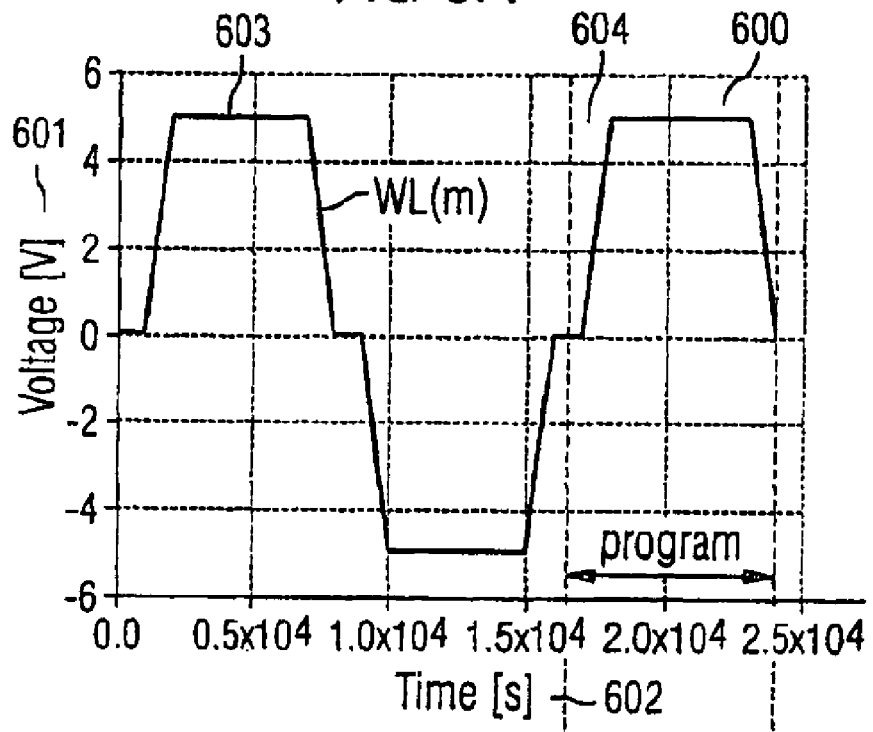
Figure 6B:
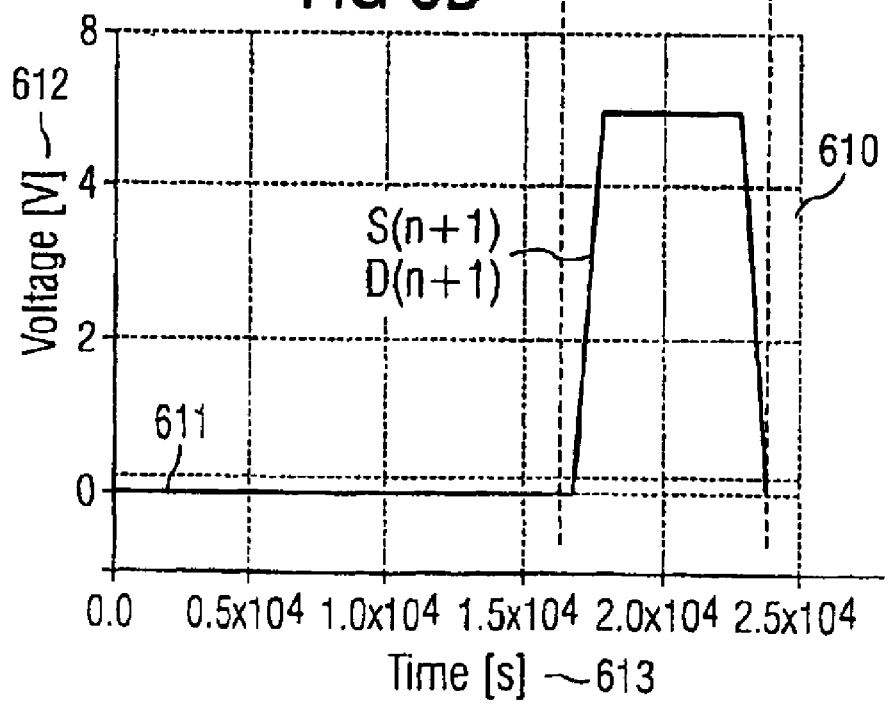

Essentially at the same time, an electric voltage of the same value of the storage voltage 141 is in each case applied to the third bit line 113 and the fourth bit line 114, as is illustrated in FIG. 6b in the diagram 610, in which a voltage profile 611 of the electric voltage 612 in each case applied to the third bit line 113 and the fourth bit line 114 is illustrated as a function of the time 613 in seconds.

In order to illustrate this driving, FIG. 6a again illustrates, in a further diagram 600, the electric voltage 601, applied to the first word line 109, as a function of the time 602 in a voltage profile 603.

It should be noted that, in accordance with this exemplary embodiment, the electric voltage applied to the first word line 109 in the programming region 604 has the same value as the electric voltage which is in each case applied to the third bit line 113 and to the fourth bit line 114.

FIG. 6c shows, in a further polarization diagram 620, the profile of the polarization 621 of the second ferroelectric transistor 106 during the programming of the first ferroelectric transistor 105, as is illustrated in FIG. 1b to FIG. 1d, as a function of the gate-substrate voltage $V_{GB}$ 622.

As can be gathered from the further polarization diagram 620, the widening of the second plateau region 623 is achieved by the suitable application of the gate-source voltage, specifically by the choice of the respective drain voltage and source voltage to be applied to the further ferroelectric transistors 106, 107, 108 in a manner dependent on the respective programming voltage and thus dependent on the respective electric voltage present at the gate.

An alteration of the state of the further ferroelectric transistors 106, 107, 108 is avoided as a result of the widening of the second plateau region 623.

As can be gathered from FIG. 6c, the second ferroelectric transistor 106 does not undergo a transition from its initial state 624 "0" to a final state "1" 625, since it cannot surmount the plateau region 623 along the hysteresis loop 626, as is symbolized by the arrows 627 in FIG. 6c.

In this connection, it should be noted that, in accordance with this exemplary embodiment, both the gate potential and the substrate potential are fixedly predetermined.

The two voltages that can be chosen at the source and drain contacts of the further ferroelectric transistors 106, 107 are driven in such a way that it holds true that the source voltage $V_S$ is equal to the applied drain voltage $V_D$ and the respective applied gate voltage $V_G$, so that the following holds true:

$$V_{GS} = V_{GD} = 0, \quad (2)$$

and thus $$V_{GS} = V_{GD} \leq V_{th} - F(P_{FE}). \quad (3)$$

On account of the matrix arrangement from FIG. 1, there are present at the ferroelectric transistor 108 the gate voltage $V_G = 0$, a source voltage and a drain voltage of, for example, $V_S = V_D = 5$ V and also a bulk voltage (substrate voltage) $V_B = 0$ V. These voltages, too, do not alter the state of the ferroelectric polarization.

If the following holds true for the ferroelectric transistor 108:

$$V_{GB} \leq V_{th} - V_{BS} - F(P_{FE}), \quad (4)$$

then the ferroelectric transistor 108 is also in inversion or possibly in accumulation.

It should be ensured that
1. the n-channel ferroelectric transistor does not enter into inversion, and
2. as a result of the bulk-source voltage $V_{BS}$, the ferroelectric transistor does not enter into accumulation more deeply than for the case where $V_{BS} = 0$ holds true.

This ensures that the respective further ferroelectric transistor 106, 107, 108 which is driven in the manner described above is operated in its depletion region 505 and not in its inversion region 506, thereby avoiding undesirable reprogramming of the respective further ferroelectric transistor 106, 107.

This can be ensured very simply in particular when the respective ferroelectric transistor has a gradient of the gate charge curve 501 that is chosen to be sufficiently small in the depletion region 505 of the said transistor.

Generally, a ferroelectric transistor and thus the further electric transistors 106, 107, 108 are operated in their depletion region 505 during the read-out of the first ferroelectric transistor 105 if the following holds true for the gate-source voltage $V_{GS}$ of the respective further ferroelectric transistor 106, 107, 108:

$$V_{FB} - F(P_{FE}) \leq V_{GS} \leq V_{th} - F(P_{FE}), \quad (5)$$

where $V_{FB}$ designates the flat-band voltage of the further ferroelectric transistor, $V_{GS}$ designates the gate-source voltage of the further ferroelectric transistor, $V_{th}$ designates the threshold voltage of the further ferroelectric transistor, $F(P_{FE})$ designates a function of the ferroelectric polarization $P_{FE}$ of the further ferroelectric transistor.

In accordance with this exemplary embodiment, the threshold voltage $V_{th}$ is prescribed in accordance with the following specification:

$$V_{th} = V_{FB} + 2\Phi_F + \gamma\sqrt{2\Phi_F + U_{SB}}, \quad (6)$$

where $$\gamma = \frac{1}{C'_{Stack}}\sqrt{q^N A^{2\varepsilon_0}\varepsilon Si}, \quad (7)$$

where $\gamma$ designates the substrate control factor and $$\Phi_F = \frac{kT}{q}\ln\frac{N_A}{n_i}, \quad (8)$$

where $\Phi_F$ designates the Fermi potential and $C'_{Stack}$ designates the gate stack capacitance of the respective further ferroelectric transistor 106, 107, 108.

In accordance with the exemplary embodiment, the parameter values listed in the following table were used for the parameters present in the above specifications:

| Parameter | Value | Unit |
| --- | --- | --- |
| $P_s$ | 0.1 | $\mu C/cm^2$ |
| $P_r$ | 0.08 | $\mu C/cm^2$ |
| Ec | 30 | kV/cm |
| $t_{fe}$ | 180 | nm |
| $t_{ox}$ | 20 | nm |
| $\varepsilon_f$ | 250 | |
| $\varepsilon_{OX}$ | 11.7 | |
| A | $2*10^4$ | $\mu m^2$ |
| $N_A$ | $2*10^{15}$ | $cm^{-3}$ |
| $V_{FB}$ | 0 | V |
| $V_D$ | 0.3 | V |
| $V_S$ | 0 | V |
| $V_B$ | 0 | V |

A number of alternatives to the exemplary embodiment presented above are explained in more detail below.

The invention is not restricted to the above-described concrete form of a memory matrix, in particular is not restricted to a memory matrix having four memory cells. The invention can be used in the context of an arbitrarily configured memory matrix having an arbitrary number of memory cells, that is to say of ferroelectric transistors as memory cells.

It should be noted in this connection that the above-described programming scheme according to the invention can also be applied to one or more selected memory cells whose state is not intended to be altered.

By way of example, all the memory cells may be initialized with the logic value "0" at the beginning of the programming scheme. If a logic value "0" is to be stored, i.e. written, in a selected memory cell ($V_G$=high for this memory cell), then its state is not altered.

In order to ensure this, the following voltages are applied to the respective memory cell whose state is not intended to be altered:

$$V_G = V_S = V_D = \text{High}. \tag{9}$$

Consequently, the state of the selected memory cell is not reprogrammed in this case.

Furthermore, a memory cell can also have a plurality of transistors, in particular a plurality of ferroelectric transistors.

The following publications are cited in this document:
[1] T. Nakamura et al. A Single-Transistor Ferroelectric Memory Cell, IEEE International Solid-State Circuits Conference, ISSCC95, Session 4, Technology Directions: Displays, Photonics and Ferroelectric Memories, pp. 68–69, 1995
[2] Jong-Son Lyu et al., Metal-Ferroelectric-Semiconductor Field-Effect Transistor (MFSFET) for Single Transistor Memory by Using Poly-Si Source/Drain and $BaMgF_4$ Dielectric, IEDM 1996, pp. 503–506, 1996
[3] U.S. Pat. No. 6,067,244

List of Reference Symbols
100 Memory matrix
101 Memory cell
102 Memory cell
103 Memory cell
104 Memory cell
105 First ferroelectric transistor
106 Second ferroelectric transistor
107 Third ferroelectric transistor
108 Fourth ferroelectric transistor
109 First word line
110 Second word line
111 First bit line
112 Second bit line
113 Third bit line
114 Fourth bit line
115 Gate of first ferroelectric transistor
116 Gate of second ferroelectric transistor
117 Gate of third ferroelectric transistor
118 Gate of fourth ferroelectric transistor
119 Source of first ferroelectric transistor
120 Source of third ferroelectric transistor
121 Drain of first ferroelectric transistor
122 Drain of third ferroelectric transistor
123 Source of second ferroelectric transistor
124 Source of fourth ferroelectric transistor
125 Drain of second ferroelectric transistor
126 Drain of fourth ferroelectric transistor
127 Read-out/storage control device
128 Bulk terminal of first ferroelectric transistor
129 Bulk terminal of second ferroelectric transistor
130 Bulk terminal of third ferroelectric transistor
131 Bulk terminal of fourth ferroelectric transistor
132 Electrical line
133 Electrical line
140 First voltage diagram
141 Voltage profile
142 Electric voltage
143 Time
144 Programming region
150 Seond voltage diagram
151 Voltage profile
152 Electric voltage
153 Time
160 Polarization diagram
161 Polarization
162 Gate-substrate voltage
163 Polarization profile
164 Initial state
165 Final state
166 Hysteresis curve
167 Arrows
168 First plateau region
169 Second plateau region
200 Profile of ferroelectric polarization in the gate of a ferroelectric transistor as a function of the gate voltage
201 Ferroelectric polarization in the gate of a ferroelectric transistor
202 Gate voltage
203 Hysteresis loop
204 First distinguishable polarization state
205 Second distinguishable polarization state
206 First non-distinguishable polarization state
207 Second non-distinguishable polarization state
300 Ferroelectric transistor
301 Substrate
302 Source region
303 Drain region
304 Silicon oxide region
305 Silicon oxide region
306 Dielectric intermediate layer
307 Channel region
308 Ferroelectric layer
309 Metallic gate electrode
310 Contact
311 Contact
312 Contact
313 Protective layer
401 Application of storage voltage to the first word line
402 Application of storage voltage to the first word line
403 Application of drain voltages and source voltages to the further ferroelectric transistors
500 Charge diagram
501 Gate charge curve
502 Gate charge
503 Gate-substrate voltage
504 Accumulation region of ferroelectric transistor
505 Depletion region of ferroelectric transistor
506 Conversion region of ferroelectric transistor
600 Diagram
601 Electric voltage
602 Time
603 Voltage profile
604 Programming region
610 Diagram
611 Voltage profile
612 Electric voltage
613 Time
620 Polarization diagram 621 Polarization
622 Gate-substrate voltage
623 Second plateau region
624 Initial state
625 Final state
626 Hysteresis loop
627 Arrow

What is claimed is:

1. Method for reading out a state from a ferroelectric transistor of a memory cell which is arranged in a memory matrix with a plurality of further memory cells with further ferroelectric transistors, the method comprising:

reading the state is out from the ferroelectric transistor;

driving at least one further ferroelectric transistor in the memory matrix during the read-out of the state in such a way that it is operated in its depletion region; and operating the further ferroelectric transistor in the depletion region by the further ferroelectric transistor being driven in such a way that the following holds true:

$$V_{FB}-F(P_{FE}) \leq V_{GS} \leq V_{th}-F(P_{FE}),$$

where $V_{FB}$ designates the flat-band voltage of the further ferroelectric transistor;

$V_{GS}$ designates the gate-source voltage of the further ferroelectric transistor;

$V_{th}$ designates the threshold voltage of the further ferroelectric transistor; and $F(P_{FE})$ designates a function of the ferroelectric polarization $P_{FE}$ of the further ferroelectric transistor.

2. Method according to claim 1, further comprising reading out the state from the ferroelectric transistor by a read-out voltage being applied to the gate electrode of the ferroelectric transistor, for the purpose of reading out the state.

3. Method according to claim 1 or 2, further comprising operating the further ferroelectric transistor in the depletion region by the further ferroelectric transistor being driven in such a way that the gate-source voltage present at the further ferroelectric transistor is less than the threshold voltage of the said transistor minus a term which is dependent on the ferroelectric polarization.

4. Method according to claim 1, further comprising operating the further ferroelectric transistor in the depletion region by the further ferroelectric transistor being driven in such a way that the gate voltage applied to the further ferroelectric transistor is equal to the source voltage applied to the further ferroelectric transistor and the drain voltage applied to the further ferroelectric transistor.

5. Method according to claim 1, further comprising using a plurality of transistors in at least one memory cell of the memory matrix.

6. A Memory matrix comprising:

a plurality of memory cells connected to one another, at least some of the memory cells having at least one ferroelectric transistor;

a read-out control device, which controls a read-out of a state from ferroelectric transistor of a memory cell of the memory matrix;

the read-out control device being set up in such a way that the state is read out from the ferroelectric transistor;

at least one further ferroelectric transistor in the memory matrix, the at least one further ferroelectric transistor being driven during the read-out state in such a way that it is operated in its depletion region; and setting up the read-out control device in such a way that the further ferroelectric transistor is driven so that the following holds true:

$$V_{FB}-F(P_{FE}) \leq V_{GS} \leq V_{th}-F(P_{FE}),$$

where $V_{FB}$ designates the flat-band voltage of the further ferroelectric transistor;

$V_{GS}$ designates the gate-source voltage of the further ferroelectric transistor;

$V_{th}$ designates the threshold voltage of the further ferroelectric transistor; and $F(P_{FE})$ designates a function of the ferroelectric polarization $P_{FE}$ of the further ferroelectric transistor.

7. Memory matrix according to claim 6, further comprising setting up the read-out control device in such a way that a read-out voltage is applied to the gate electrode of the ferroelectric transistor, for the purpose of reading out the state.

8. Memory matrix according to claim 6, further comprising setting up the read-out control device in such a way that the further ferroelectric transistor is driven in such a way that the gate-source voltage present at the further ferroelectric transistor is less than the threshold voltage of the said transistor minus a term which is dependent on the ferroelectric polarization.

9. Memory matrix according to one of claims 6 to 8, in which at least one memory cell of the memory matrix has a plurality of transistors.

10. Memory matrix according to claim 6, in which the read-out control device is set up in such a way that the further ferroelectric transistor is driven so that the gate voltage applied to the further ferroelectric transistor is equal to the source voltage applied to the further ferroelectric transistor and the drain voltage applied to the further ferroelectric transistor.

11. Method for storing a state in a ferroelectric transistor of a memory cell which is arranged in a memory matrix with a plurality of further memory cells with further ferroelectric transistors, the method comprising:

storing the state in the ferroelectric transistor;

driving the at least one further ferroelectric transistor in the memory matrix during the storage of the state in such a way that it is operated in its depletion region; and operating the further ferroelectric transistor in the depletion region by the further ferroelectric transistor being driven in such a way that the following holds true:

$$V_{FB}-F(P_{FE}) \leq V_{GS} \leq V_{th}-F(P_{FE}),$$

where $V_{FB}$ designates the flat-band voltage of the further ferroelectric transistor;

$V_{GS}$ designates the gate-source voltage of the further ferroelectric transistor;

$V_{th}$ designates the threshold voltage of the further ferroelectric transistor; and $F(P_{FE})$ designates a function of the ferroelectric polarization $P_{FE}$ of the further ferroelectric transistor.

12. Method according to claim 11, further comprising storing the state in the ferroelectric transistor by a storage voltage being applied to the gate electrode of the ferroelectric transistor for reading out the state.

13. Method according to claim 11 or 12, further comprising operating the further ferroelectric transistor in the depletion region by the further ferroelectric transistor being driven in such a way that the gate-source voltage present at the further ferroelectric transistor is less than the threshold voltage of the said ferroelectric transistor minus a term which is dependent on the ferroelectric polarization.

14. Method according to claim 11, further comprising operating the further ferroelectric transistor in the depletion region by the further ferroelectric transistor being driven in such a way that the gate voltage applied to the further ferroelectric transistor is equal to the source voltage applied to the further ferroelectric transistor and the drain voltage applied to the further ferroelectric transistor.

15. Method according to claim 11, further comprising using a plurality of transistors in at least one memory cell of the memory matrix.

16. A memory matrix comprising:
  a plurality of memory cells connected to one another, at least some of the memory cells having at least one ferroelectric transistor;
  a storage control device, which controls the storage of a state in a ferroelectric transistor of a memory cell of the memory matrix;
  the storage control device being set up in such a way that the state is stored in the ferroelectric transistor;
  at least one further ferroelectric transistor in the memory matrix, the at least one further ferroelectric transistor being driven during the storage of the state in such a way that it is operated in its depletion region, wherein the storage control device is set up in such a way that the further ferroelectric transistor is driven so that the following holds true:

$$V_{FB} - F(P_{FE}) \leq V_{GS} \leq V_{th} - F(P_{FE}),$$

where
  $V_{FB}$ designates the flat-band voltage of the further ferroelectric transistor;
  $V_{GS}$ designates the gate-source voltage of the further ferroelectric transistor;
  $V_{th}$ designates the threshold voltage of the further ferroelectric transistor; and
  $F(P_{FE})$ designates a function of the ferroelectric polarization $P_{FE}$ of the further ferroelectric transistor.

17. Memory matrix according to claim 16, further comprising setting up the storage control device in such a way that a storage voltage is applied to the gate electrode of the ferroelectric transistor, for the purpose of storing the state.

18. Memory matrix according to claim 16, further comprising setting up the storage control device in such a way that the further ferroelectric transistor is driven in such a way that the gate-source voltage present at the further ferroelectric transistor is less than the threshold voltage of the said transistor minus a term which is dependent on the ferroelectric polarization.

19. Memory matrix according to claim 16 to 18, in which at least one memory cell of the memory matrix has a plurality of transistors.

20. Memory matrix according to claim 16, further comprising setting up the storage control device in such a way that the further ferroelectric transistor is driven so that the gate voltage applied to the further ferroelectric transistor is equal to the source voltage applied to the further ferroelectric transistor and the drain voltage applied to the further ferroelectric transistor.

* * * * *

UNITED STATES PATENT AND TRADEMARK OFFICE
CERTIFICATE OF CORRECTION

PATENT NO. : 6,944,044 B2
APPLICATION NO. : 10/432441
DATED : September 13, 2005
INVENTOR(S) : Holger Goebel et al.

It is certified that error appears in the above-identified patent and that said Letters Patent is hereby corrected as shown below:

On the Title page, field number (75) listed as Inventors: delete "NY" and add -- VT --;

On the Title page, field number (75) listed as Inventors:, please add to the bottom of the inventor list the name -- Marc Ullmann, Altdorf (DE) --.

On the Title page, field number (30) listed as Foreign Application Priority Data delete " 100 64 031 " and add -- 100 64 031.1 --.

On the Title page, under the listing OTHER PUBLICATIONS, the second publication delete " 1998 " and add -- 1996 --.

Column 4, line 47 delete "ferro electric" and add -- ferroelectric --;

Column 4, line 53 delete "ferro electric" and add -- ferroelectric --;

Column 4, line 55 delete "ferro electric" and add -- ferroelectric --.

Signed and Sealed this

Tenth Day of July, 2007

JON W. DUDAS
*Director of the United States Patent and Trademark Office*